(12) United States Patent
Olynick et al.

(10) Patent No.: US 8,546,264 B2
(45) Date of Patent: Oct. 1, 2013

(54) ETCHING RADICAL CONTROLLED GAS CHOPPED DEEP REACTIVE ION ETCHING

(75) Inventors: Deirdre Olynick, El Cerrito, CA (US); Ivo Rangelow, Baunatal (DE); Weilun Chao, El Cerrito, CA (US)

(73) Assignee: The Regents of the University of California, Oakland, CA (US)

( * ) Notice: Subject to any disclaimer, the term of this patent is extended or adjusted under 35 U.S.C. 154(b) by 1324 days.

(21) Appl. No.: 11/421,958

(22) Filed: Jun. 2, 2006

(65) Prior Publication Data

US 2007/0015371 A1    Jan. 18, 2007

Related U.S. Application Data

(60) Provisional application No. 60/687,392, filed on Jun. 2, 2005.

(51) Int. Cl.
*H01L 21/302* (2006.01)
*H01L 21/461* (2006.01)

(52) U.S. Cl.
USPC ............. 438/712; 438/700; 438/706; 216/58; 216/66

(58) Field of Classification Search
USPC ................ 438/706, 700, 712; 216/58, 66
See application file for complete search history.

(56) References Cited

U.S. PATENT DOCUMENTS

| | | | |
|---|---|---|---|
| 4,528,066 A * | 7/1985 | Merkling et al. | 438/696 |
| 5,501,893 A | 3/1996 | Laermer et al. | |
| 7,217,336 B2 * | 5/2007 | Strang | 156/345.34 |
| 2003/0164354 A1 * | 9/2003 | Hsieh et al. | 216/22 |
| 2005/0014375 A1 * | 1/2005 | Kim et al. | 438/690 |
| 2005/0095806 A1 * | 5/2005 | Nevin et al. | 438/424 |
| 2006/0000797 A1 * | 1/2006 | Adams et al. | 216/37 |

OTHER PUBLICATIONS

Blauw et al. (Journal of Vacuum Science and Technology, B 20(6), Nov./Dec. 2002, pp. 3106-3110).*
Volland et al. (Journal of Vacuum Science and Technology B 17(6) (1999) (pp. 2768-2771).*
Blauw MA, et al., Advanced time-multiplexed plasma etching of high aspect ratio silicon, J. Vac. Sci. Technol. B20(6):3106-3110, 2002.

(Continued)

*Primary Examiner* — Duy Deo
*Assistant Examiner* — Mahmoud Dahimene
(74) *Attorney, Agent, or Firm* — Robin C. Chiang; Lawrence Berkeley National Laboratory

(57) ABSTRACT

A method for silicon micromachining techniques based on high aspect ratio reactive ion etching with gas chopping has been developed capable of producing essentially scallop-free, smooth, sidewall surfaces. The method uses precisely controlled, alternated (or chopped) gas flow of the etching and deposition gas precursors to produce a controllable sidewall passivation capable of high anisotropy. The dynamic control of sidewall passivation is achieved by carefully controlling fluorine radical presence with moderator gasses, such as $CH_4$ and controlling the passivation rate and stoichiometry using a $CF_2$ source. In this manner, sidewall polymer deposition thicknesses are very well controlled, reducing sidewall ripples to very small levels. By combining inductively coupled plasmas with controlled fluorocarbon chemistry, good control of vertical structures with very low sidewall roughness may be produced. Results show silicon features with an aspect ratio of 20:1 for 10 nm features with applicability to nano-applications in the sub-50 nm regime. By comparison, previous traditional gas chopping techniques have produced rippled or scalloped sidewalls in a range of 50 to 100 nm roughness.

20 Claims, 9 Drawing Sheets

(56) References Cited

OTHER PUBLICATIONS

Goodyear AL, et al., High resolution inductively coupled plasma etching of 30 nm lines and spaces in tungsten and silicon, J. Vac. Sci. Technol. B18(6):3471-3475, 2000.

Kok KW, et al., Investigation of in situ trench etching process and Bosch process for fabricating high-aspect-ratio beams . . . , J. Vac. Sci. Technol. B20(5): 1878-1883, 2002.

Labelle CB et al., Investigation of fluorocarbon plasma deposition from c-C4F8 for use as passivation during deep silicon etching, J. Vac. Sci. Technol. A22(6): 2500-2507, 2004.

Min J.-H., et al., Dependence of bottom and sidewall etch rates on bias voltage and source power during the etching of . . . , J. Vac. Sci. Technol. B22(3): 893-901, 2004.

Nozawa T, et al., The electron charging effects of plasma on notch profile defects, Jpn. J. Appl. Phys. 34:2107-2113, 1995.

Olynick DL, et al., Substrate cooling efficiency during cryogenic inductively coupled plasma etching for dioffractive . . . , J. Vac. Sci. Technol. B19(6): 2896-2900, 2001.

Olynick DL, et al., Profile evolution of Cr masked features undergoing HBr-inductively coupled plasma etching for use in . . . J. Vac. Sci. Technol. B23(5): 2073-2077, 2005.

Olynick DL, et al., Nanoscale pattern transfer for NEMs and Nano-optics, Proc. SPIE-Intl. Soc. for Optical Engin. (2007), 6462(Micromachining for Micro- and and Nano-Optics V).

Rangelow IW, Critical tasks in high aspect ration silicon dry etching for microelectromechanical systems, JVST A21(4): 1550-1562, 2003.

Woodworth JR, et al., Absolute intensities of the vacuum ultraviolet spectra in a metal-etch plasma processing discharge, J. Vac. Sci. Technol, A17(6): 3209-3217, 1999.

Volland B, et al., Dry etching with gas choopping without rippled sidewalls, J. Vac. Sci. Technol. B17(6): 2768-2771, 1999.

Volland B, et al., Profile simulation of gas chopping based etching processes, J. Vac. Sci. Technol. B20(6): 3111-3117, 2002.

Oxford Instruments, Plasmalab Data: ICP-PECVD: SiN, Nov. 2004.

\* cited by examiner

ETCHING RADICAL CONTROLLED GAS CHOPPED DEEP REACTIVE ION ETCHING

CROSS REFERENCE TO RELATED APPLICATIONS

This application claims benefit of priority to U.S. Provisional patent application 60/687,392, filed Jun. 2, 2005, which is hereby incorporated by reference in its entirety.

STATEMENT REGARDING FEDERAL FUNDING

This invention was made with U.S. Government support under Contract Number DE-AC02-05CH11231 between the U.S. Department of Energy and The Regents of the University of California for the management and operation of the Lawrence Berkeley National Laboratory. The U.S. Government has certain rights in this invention.

REFERENCE TO A COMPUTER PROGRAM

Not applicable.

BACKGROUND OF THE INVENTION

1. Field of the Invention

The present invention pertains generally to methods used in lithographic etching, more specifically to high aspect ratio anisotropic etching with smooth etched sidewalls.

2. Description of the Relevant Art

Etching of Si surfaces using halogens plasmas is a central process in the microstructuring of semiconductors. There has been an extensive effort over the past decade to move from the microstructure regime to the nanostructure regime to develop nanoelectronic devices, Nano Electro Mechanical Systems (NEMS), and nanoresolution templates for Nano Imprint Lithography (NIL).

Dry etching processes must fulfill a number of requirements: adequate etch profile and selectivity control with respect to the mask and materials beneath the mask to be etched, no significant substrate damage, and sufficiently high etching rates. These requirements become even more stringent when etching nanoresolution devices due to the extremely small dimensions involved.

Generally, high-resolution anisotropic silicon (Si) etching is performed using high density, low-pressure plasma discharges employing halogen gases comprising bromine (Br) or chlorine (Cl). Etching Si with Cl and Br requires both the selective transport of low energy reactive species and bombardment by highly energetic particles. A large body of literature explains many of these underlying etching mechanisms.

Unfortunately, bombardment by energetic particles induces complications due to radiation damage, undercutting, and contamination. Some of these issues, such as radiation damage from ultraviolet and X-ray photons [J. R. Woodworth, M. G. Blain, R. L. Jarecki, T. W. Hamilton, 1449 B. P. Aragon, J. Vac. Sci. Technol. A17 (1999) 3209] and charge-build-up of positive ions and electrons [T. Nozawa, T. Kinoshita, Jpn. J. Appl. Phys. 34 (1995) 2107] can result in detrimental device performance. These are very serious problems to overcome for manufacturing of future nano-scale devices (devices with characteristic dimensions typically measured in nm, or $10^{-9}$ m).

Fluorine's spontaneous reaction with silicon is generally advantageous, because no high-energy ion bombardment is necessary for etching, thereby minimizing lattice damage. Unfortunately, this spontaneous Si+F reaction makes anisotropy control a very difficult issue.

A gas chopping process is capable of controlling the anisotropy by alternating steps of sidewall passivation with etching steps. In combination with an inductively couple plasma (ICP) reactor, gas chopping offers the unique opportunity to control the energy and density of the ion and neutral fluxes almost independently, with minimum overlap between the etching and passivation steps as the precursors are switched. Consequently, gas chopping has become a very important process for MEMS fabrication.

Extending gas-chopping technology to the sub-50 nm regime is challenging. Gas chopping typically results in a roughness, scalloping, or rippling of the sidewalls. In the gas chopping technique, periodically changing the supply of deposition and etch precursors produces overall anisotropically etched trenches, however, the sidewall surfaces of etched features are typically rippled. Each ripple represents a single deposition and etching cycle.

To improve the sidewall ripple problem, it has been found essential to generate certain radicals in fluorocarbon plasmas. The dependence of anisotropy on etching conditions in a gas chopping deep reactive etching technique GChDRIE has been described in previous publications [B. E. Volland, Tzv. Ivanov, and I. W. Rangelow, J. Vac. Sci. Technol. B 20 (2002) 3111].

To achieve smoother sidewall structures a modified Gas Chopping Deep Reactive Ion Etching (GChDRIE) process has been developed [B. Volland, F. Shi, P. Hudek, H. Heerlein, and I. W. Rangelow, J. Vac. Sci. Technol. B 17 (1999) 2768]. In this process the isotropic etching step is replaced by an anisotropic etching step. When this technique is combined with ICP and fluorine chemistry, it provides high etching rates and satisfying sidewall slope control. By increasing the gas-chopping frequency, the amplitude of the ripples are reduced to the 10 nm range, but this is still too large for sub-50 nm structures. While increasing the chopping frequency still further is theoretically possible, in practice this cannot be achieved due to the relatively long residence times of gas precursors and products, coupled with limited pumping speeds.

Therefore, there is a need in the area of plasma etching for optimizing the performance of gas chopping etching processes to be able to transfer anisotropically etched nanofeatures in the sub-50 nm regime.

BRIEF SUMMARY OF THE INVENTION

In one embodiment, a method of etching radical reduced, gas chopped deep reactive ion etching is disclosed, comprising: a) means for ion etching comprising: i) an etchant; and ii) a passivator; b) ionizing at least some of the etchant and passivator; and c) controlling a concentration of radicals produced by the ionizing of the etchant.

The method above may further comprise: a) producing a smooth sidewall on a material being etched. The resultant smooth sidewall may have a surface roughness of less than 10 nm root mean square (RMS), less than 5 nm RMS, less than 2 nm RMS, less than 1 nm RMS.

The controlling step above may comprise: a) providing a getter to reduce the concentration of radicals produced by the ionizing of the etchant. The getter of may comprise: a) a source of hydrogen that reacts with radicals produced by the ionizing of the etchant, so as to render the etchant ineffective at etching. The getter may comprise: a) a source of hydrogen selected from the group consisting of: i) hydrogen gas, forming gas, methane, butane, a hydrocarbon, a mixture of hydrogen gas and one or more inert gasses. Methane gas $CH_4$, may also function as the getter.

The etchant above may comprise: a) a chemically active etchant, and b) an etchant active by ion bombardment.

The passivator above may comprise: a) a gaseous vapor phase $CF_2$. The gaseous vapor phase $CF_2$ may be evolved from a heated surface. The heated surface may also comprise the chamber wall. The chamber wall may also be coated in polytetrafluoroethane (PTFE), or alternatively, a surface of PTFE may be ion bombarded so as to provide gaseous vapor phase $CF_2$.

A product created by the process above. Such product may have critical dimensions (CDs) of 50 nm or less.

An apparatus may perform the process above.

The material to be etched may be Al, Mo, Ti, Si, W, Cr, or any material that has high reactivity to halogen gases. These materials may be doped or undoped materials. Less suitable materials would be Ni, and least suitable materials would be Cu.

The passivation above may be a PTFE-like poly($CF_2$), or $(CF_2)_n$.

BRIEF DESCRIPTION OF THE SEVERAL VIEWS OF THE DRAWINGS

The invention will be more fully understood by reference to the following drawings, which are for illustrative purposes only.

DETAILED DESCRIPTION

Defined Terms

Figure 1:
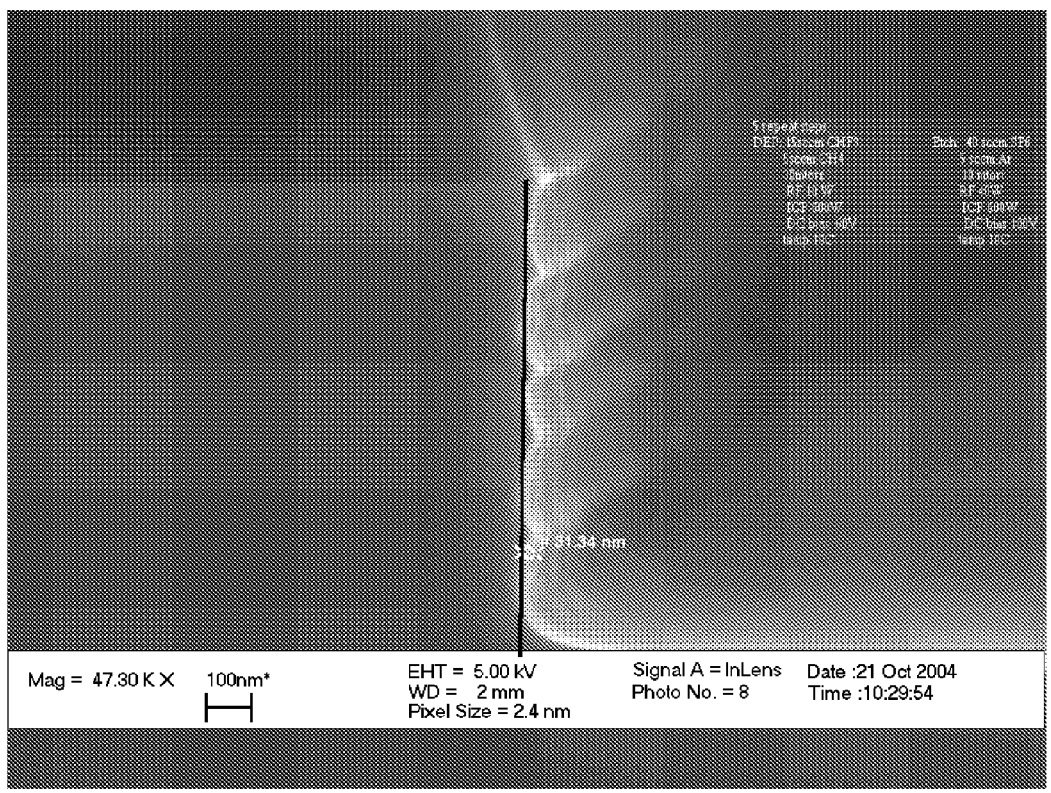
FIG. 1 is a process parameter estimation step having the following parameters: Substrate temperature 10° C. Reactor wall temperature: 60° C.; Etching: SF6: 40 sccm, Ar: 5 sccm, 10 mTorr, RFbias=40 Watt, DC=−100V; Deposition: 15 sccm CHF3, 5 sccm CH4, 30 mTorr, ICP=600 Watt; RFbias=10 Watt; DC=−60 V.
Figure 1:
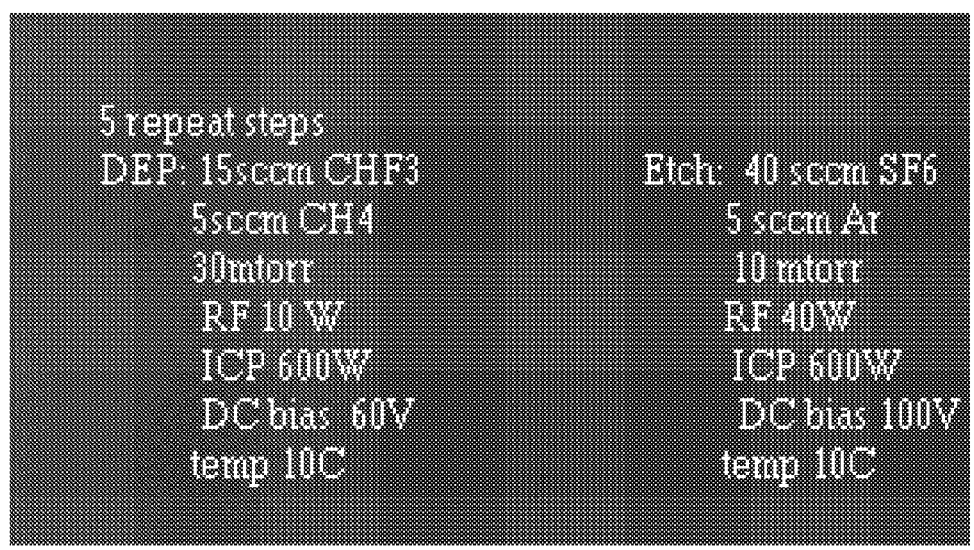

Computer means any device capable of performing the steps developed in this invention to result in an optimal etching radical controlled gas chopped deep reactive ion etching process, including but not limited to: a microprocessor, a digital state machine, a field programmable gate array (FGPA), a digital signal processor, a collocated integrated memory system with microprocessor and analog or digital output device, a distributed memory system with microprocessor and analog or digital output device connected with digital or analog signal protocols.

Computer readable media means any source of organized information that may be processed by a computer to perform the steps developed in this invention to result in an optimal etching radical controlled gas chopped deep reactive ion etching process, but not limited to: a magnetically readable storage system; optically readable storage media such as punch cards or printed matter readable by direct methods or methods of optical character recognition; other optical storage media such as a compact disc (CD), a digital versatile disc (DVD), a rewritable CD and/or DVD; electrically readable media such as programmable read only memories (PROMs), electrically erasable programmable read only memories (EEPROMs), field programmable gate arrays (FGPAs), flash random access memory (flash RAM); and remotely transmitted information by electromagnetic or optical methods.

Forming gas means an industrial gas typically comprising 8% hydrogen and 92% nitrogen, 2% hydrogen and 98% nitrogen, or 10% H and 90% N.

Gas chopped means sequentially alternating atmospheric or plasma states in cycles, having at least one cycle, but potentially more than one cycle. Here gas chopped is used to describe differing and alternating vacuum conditions and vacuum constituents during etching radical controlled deep reactive ion etching processing.

Passivant means a chemical that is largely nonreactive to intended chemical exposure, hence passive, which is used to passivate a surface.

Preamplifier means an amplifier that amplifies a small input signal sufficiently to prevent degradation of an output signal used in further processing.

Introduction

This application describes the patterned transfer of sub-50 nm to sub-20 nm features into silicon with high aspect ratio by employing an etching chemistry comprising fluorine, where the general problem is the control of the anisotropy and CD. To obtain smooth sidewalls for nanostructures, it has been found that low etching pressures and reduced gas-chopping time steps are very important. Furthermore, because under optimal operating conditions the gas-chopping time steps can no longer be considered discreet, the control of etching radicals with the addition of a scavenger (or getter) comprising hydrogen is also required. With the addition of an efficient source of $CF_2$ radicals, the etching step can be made highly anisotropic, thereby further enhancing sidewall smoothness.

Following below, the different steps of the process are discussed.

I. Process Overview

Passivation

In one embodiment, the etching process may be alternated by passivation steps followed by etching steps. The passivation steps for one processing chamber may occur at about 30 mT. The etching step for the same chamber may occur at about 7 mT. Gas pressures are typically measured by standard low-pressure measurement devices such as a manometer.

During the passivation step, $CHF_3$ or another precursor which can break down to $CF_2$, is added to a processing chamber. The processing chamber may at a low vacuum of 10-60 mT, more preferably 20-40 mT, and most preferably at 30-35 mT. One optimal processing pressure was found to be 30 mT for a specific chamber. The duration of the passivation depends on the chamber, the degree of quasi-equilibrium between the passivation and etching steps, and the characteristic dimensions of the device to be fabricated from the substrate. For a 50 nm characteristic dimension device, passivation times are preferably 1-30 seconds, more preferably 10-20 seconds, and most preferably 3-10 seconds.

Also during the passivation step, $CH_4$ is added to provide an atomic hydrogen source as a getter for F atoms and ions present. Alternative hydrogen sources that break down to atomic hydrogen under chamber operating conditions would be readily apparent to people skilled in the art.

The chamber is a pumped vacuum chamber, and is maintained 50-300° C. In one chamber, 50° C. or greater was found adequate. The chamber, which has been conditioned for the gas chopping process, serves as a subsequent source for gaseous vapor $CF_2$. Alternatively, an alternate heated structure may serve as a source for gaseous vapor $CF_2$. Potentially, even a heated surface of PTFE could serve as a source for gaseous vapor $CF_2$ with suitable ion bombardment so as to break the $(CF_2)_n$ bonds to gaseous vapor $CF_2$.

Etching

During the etching step, $SF_6$, or an alternative etchant effective for a target substrate, is admitted into the chamber though a mass flow rate controlled device (such as a mass flow controller). A rather exotic such alternative etchant could be $XeF_2$. The chamber pressure for this step ranges from 1-15 mT, more preferably 5-9 mT, and most preferably 7 mT for one test chamber. The target substrate is maintained at a temperature which allows efficient coating of a passivator depending on the interaction of the passivator precursors and the material sidewall. For Si, this temperature is in the range of about −10 to 10° C. More preferably, for Si the substrate is maintained at about 10° C. For W the temperature would likely be lower, for Mo, higher. Most preferably, the substrate is maintained at a temperature so as to capture (or condense) gaseous vapor $CF_2$ for a sufficient time to polymerize with other incoming gaseous vapor $CF_2$ molecules. It is thought that the substrate must be warm enough for the captured $CF_2$ molecules to "move about" so as to more successfully form polymerized $(CF_2)_n$. It is thought that the $(CF_2)_n$ acts as a passivation to isotropic etching for the subject target. This makes eminent sense, since PTFE is so chemically stable as to be resistant to nearly all acids.

Etching in Brief

Our approach to nanoscale etching using gas chopping is thus as follows:
(i) Alternating steps of etching using $SF_6$ and Ar (for passivant breakthrough) and deposition using fluorocarbons
(ii) $CHF_3$ and $CH_4$ as precursors for $CF_2$ passivant formation (hydrogen generated by $CH_4$ dissociation as fluorine scavenger)
(iii) Use cold Si wafer and hot chamber sidewalls to promote selective $CF_2$ sticking
(iv) Use passivant film formed on hot chamber sidewalls (t>50° C.) upon conditioning as a source of CF2 during etching and passivation—makes etching step anisotropic.
(v) Tune etching and passivation parameters to maintain proper balance between etching and deposition at chamber walls using sidewall response of etched features.

After properly conditioning the chamber, the SF6 flux is tuned. FIG. 4 shows the effect of reducing SF6 flux. In the 4c, sidewall ripples are in the 5 nm range. In FIG. 5A, using a high-resolution patterned HSQ mask, this low sidewall roughness is transferred into nanometer sized features.

Chamber Conditioning

Conditioning of the chamber, which in one case is the supply source for gaseous vapor $CF_2$, requires the repetition of the passivation and etching steps through a number of cycles. As stated above, supply source for gaseous vapor $CF_2$ could be an alternate implementation than the chamber. A "dummy" substrate that is not necessarily the one to be finally produced may or may not be placed on a cold block that provides thermal regulation of a process substrate.

The chamber is then cycled through a number of passivation-etching cycles, with each completion of a passivation and etching step forming a complete cycle. A state of quasi-equilibrium is reached when one cycle produces the same evolution of gaseous vapor $CF_2$ as the preceding cycle. Typically, this requires from 10 to 40 cycles, although for one chamber normally about 20 cycles are adequate.

Quasi-equilibrium is reached when etching of features on a substrate have "smooth" walls normal to the instantaneous plane of the substrate above the wall. Thus, it is certainly possible to produce smooth walls for substantially planar substrates, and it may be possible to produce smooth walls for noncoplanar surfaces, such as conic sections, cylinders, etc. The degree of "smoothness" required is typically dependent on the characteristic dimension of the device, but may be independent. Typical "smoothness" levels achieved range from less than 50 nm RMS, less than 20 nm RMS, less than 15 nm RMS, less than 10 nm RMS, less than 5 nm RMS, to less than 1 nm RMS. It is thought that the process may be used to achieve even smoother surfaces with less than 0.5 nm RMS or less than 0.1 nm RMS surface roughnesses.

Chamber, or gaseous vapor $CF_2$ source, conditioning appears to be required for this process to work. Investigations of substrate deposits in an unconditioned chamber by x-ray photon spectroscopy (XPS) have shown that the ratio of $CF_2$ divided by $CF_x$ is very much smaller than in a conditioned chamber. XPS indicates the qualitative degree of bond strengths for $CF_x$ (x=1, 2, or 3).

With conditioning, the $CF_2/CF_x$ ratio could become as high as two or three orders of magnitude greater. It has been found that when this ratio increases relative to an unconditioned chamber, better or smoother etched sidewalls are obtained on the fabricated devices.

With improper, or no conditioning, it has been found that the deposited passivator has a significantly smaller $CF_2/CF_x$ ratio. When this ratio is smaller the sidewalls are no longer smooth. We surmise this is because the stoichiometry of the passivator source (in this case, the sidewalls, becomes too carbon rich to be a quasi-equilibrium source of $CF_2$).

Device Fabrication

The time steps for passivation and etching may be varied depending on the chamber or gaseous vapor $CF_2$ source size, temperature. These time steps may also be varied during device fabrication to accommodate deeper anisotropic etches. Rephrasing this, when the etching is deeper, it takes both more time to passivate, and more time to etch per cycle. For example, when etching 70 nm in depth over three cycles with constant times for each cycle step, the first etch will be deeper than the last.

II. Experimental

Two types of imaging etch mask layers were employed, hydrogen silsesquioxane, [(HSQ), Fox-15, Dow Corning, 18% solids], which acts as a negative electron beam resist, and ZEP-520 (ZEON corporation), a positive electron beam photoresist. For HSQ exposures, wafers were coated with a 4% solution of HSQ (Fox-15, Dow Corning, 18% solids) spun at 1000 rpm and oven baked 5 min on a copper plate at 170° C. producing a 100 nm film. After exposure, wafers were developed in a 25% concentration of TMAH for 2 min. For ZEP-520 exposures, wafers were coated with a 33% solution of ZEP-520 at 1000 rpm, baked 5 min at 170° C., and after exposure, developed in xylene for 3 min, followed by an IPA rinse. Patterns were exposed in a modified 7 Leica VB6HR e-beam lithography tool at 100 keV with 450 pA beam current and a 5 nm spot size Etching was performed in deep reactive ion-etching tool from Oxford Plasma Technology. In addition to the 13.65 MHz radio frequency (RF) power applied to the electrodes, the tool has another RF power source connected to a single-turn coil around the processing chamber. This dual RF power arrangement allows the generation of high-density plasmas for deep silicon etching applications. A complete description of this piece of equipment as well as process optimization techniques was presented previously in this journal [I. W. Rangelow, J. Vac. Sci. Technol. A21 (2003)1550].

III. Etching with Alternated Sidewall Passivation

Low-pressure, high density plasmas, such as inductively coupled plasma (ICP) employing fluorocarbon chemistry are commonly used for Si dry etching because of their capability to achieve anisotropic etching at high etching rates. Anisotropy is controlled by simultaneously trying to find the right synergy of spontaneous chemical etching, deposition of passivation species to protect the sidewall, and ion bombardment to remove passivators on the bottom of the pattern to allow etching to continue. These three contributions depend on the local fraction of coverage of reactive species (deposition and etching precursors).

The idea of the GChDRIE is to temporarily separate the different effects of etching and deposition, in order to carry out each step at optimized conditions [K. Tsujimoto, S. Tachi, K. Ninomiya, K. Suzuki, S. Okudaira, and S. Nishimatsu, in Ext. Abstracts 18th Int. Conf. S. St. Devices and Materials, Tokyo IEEE, New York, p. 229 (1986)], [I. W. Rangelow, Proc. SPIE 1392, 180 (1990)]. The approach to GChRIE is to have an alternating etchant precursor flow ($SF_6$) and carbon-fluorine-containing gases (such as $C_4F_8$ or $CHF_3$) as the precursors for sidewall passivation. With this approach, first an isotropic etching step with $SF_6$ plasma is carried out for a duration of a few seconds to minutes, creating an isotropic or anisotropic etch profile of a depth of a few hundreds of nanometers. The second step is a deposition step to form the passivation layers. The duration for this second step depends on the passivation efficiency and is usually shorter than the etching step. These two steps are repeated, alternating throughout the complete etching process. The result is an anisotropic profile with sidewall angles ranging from slightly positive to vertical to negative (retrograde) but with high sidewall scalloping or roughness.

As we attempt to improve this scalloping, we consider two critical issues: 1) the residence time of the process gases used at each etching step (so we can efficiently increase the chopping frequency while controlling the radicals present at each step); and 2) the best way to optimize passivation.

If the residence time $\tau$ of the process step gases in the plasma chamber is longer than the duration of individual process steps (chopping time step), the etching and deposition steps in the gas chopping process can no longer be considered discreet and cannot be optimized independent of the other step. The residence time $\tau$ was considered using the equation: $\tau = V/S$, where V is the volume of the reactor, and S is the effective pumping speed. The effective pumping speed for various positions of the throttle valve and various process gases were calculated using the equation $S = Q/p$, where p is the pressure in the chamber, and Q the flow rate of the process gas. Values of p and Q are considered to be the steady state values (this is only true if the mass flow controllers (MFCs) used to control the process gases reach the demanded flow rate within a time much shorter then the process step time). For typical process pressures and gas flow rates, the residence times for different process gases are in the range of fractions of one second up to several seconds. When switching from one process gas to the other, the partial pressure p of the process gas of the previous step decreases exponentially according to $p(t) = p_0 e^{(-t/\tau)}$, where $p_0$ is the initial partial pressure (i.e., the partial pressure right before the flow of that gas is being turned off). After the residence time $\tau$, the partial pressure has dropped to approximately one third of the initial pressure (one time constant or $e^{-1}$). Thus, maintaining discreet etching and passivation steps temporally requires that the process step times are larger than approximately five times the residence time.

The etching rate is determined by the balance between the fluxes of the reactive species: adsorption of reactive precursors from the gas phase and desorption of reactive products (for simplification the surface diffusion on the surface due to gradients is not considered). The desorption of reactive species can be spontaneous and/or ion-induced. Adding a passivator, the lateral and vertical etching rates are affected by the composition and degree of passivator coverage. Predictably, $CF_x$ (x=1, 2, 3) radicals, particularly $CF_2$ have been supposed to be the main passivation precursors in fluorocarbon plasmas. The film is created by attaching $CF_x$ radicals on the surfaces, forming a polytetrafluoroethylene (PTFE)-like $(CF_2)_n$ film. It has been shown that the deposition rate of fluorocarbon film rises with the gas phase $CF_x$ densities [R. D'Agostino, F. Cramarossa, V. Colaprico, and R. d'Ettole, J. Appl. Phys. 54, 1284 (1983)].

The temperature dependence of the fluorocarbon film deposition on the substrate plays a very important role in the fluorocarbon film deposition and removal. It has been experimentally demonstrated that in an inductively coupled etching reactor with $CF_4$ plasma, it is possible to control the $CF_2$ radical density with 2 to 3 orders of magnitude increase in concentration by reactor wall heating and pulse modulation of RF power. Other studies have shown that wall heating from 100° C. to 200° C. led to a dramatic increase in $CF_x$ density while the F density remained almost constant and the etch selectivity was improved at high wall temperature [S. Ito, K. Nakamura and H. Sugai, "Radical control by wall heating of a fluorocarbon etching reactor", Jpn. J. Appl. Phys., Vol. 33, 1261 (1994)], [H. Sugai, K. Nakamura, Y. Hikosaka, M. Nakamura, "Diagnostics and control of radicals in an inductively coupled etching reactor", J. Vac. Sci. Technol. A 13, 887 (1995)], [M. Schaepkens, R. C. M. Bosch, T. E. F. M. Standaert, G. S. Oehrlein, J. M. Cook, "Influence of reactor wall conditions on etch process in inductively coupled fluorocarbon plasmas", J. Vac. Sci. Technol. A 16(4), 2099 (1998)]. Generally, plasmas generated from precursors such as $CF_4$, $CHF_3$, and $C_2F_6$, result in a low concentration of $CF_2$ and $CF_3$ radicals, as well as a high concentration of F atoms, because of the higher level of dissociation by high-energy electrons. As a result, a lesser level of polymerization minimizes etching selectivity with respect to HSQ mask layer. On the other hand, precursors as $C_3F_8$, $C_4F_8$ cause a higher concentration of $CF_2$ radicals, because the number of high-energy electrons is relatively low by the large cross sections of the electron collisions in momentum transfer and vibrational excitation at around 5 eV [H. Itoh, J. Phys. 24 (1991) 277]. However, when $C_4F_6$/Ar is substituted for $C_4F_8$/Ar, it is observed that a high level of polymer accumulates onto the chamber sidewalls.

The polymer deposition rate depends on the concentration of the passivation precursors. The polymer erosion rate is probably controlled by factors including: atomic fluorine flux (density), energy of the ion flux, and the temperature of the surface undergoing polymer erosion. It is well known that by increasing the $H_2$ partial pressures in $CF_4/H_2$ plasmas, F atoms can be scavenged resulting in a fluorine poor plasma, which can in turn be used to achieve surface production of $CF_2$ and CF radicals [K. Sasaki, H. Furukawa and K. Kadota, "Surface production of CF, $CF_2$, and $C_2$ radicals in high-density $CF_4/H_2$ plasmas", J. Appl. Phys. Vol. 88, No. 8, 5585 (2000)]. For this purpose we employ $CH_4/CHF_3$ mixture as a $CF_2$-polymer precursor.

To optimize the gas chopping for nanometer characteristic dimension features considering the issues of residence time and passivation efficiency as discussed above, we developed a method that would allow the maintenance of a quasi-stable concentration balance between the deposition ($CF_x$ radicals) and etch precursors, while reducing the influence of the deposition step that would otherwise cause scallops on the sidewalls.

The procedure is based on three steps:
(i) conditioning the reactor sidewalls by the dummy discharge of fluorocarbon plasmas at fixed chamber wall temperature (t>50° C.);
(ii) estimating the relative concentration of sidewall inhibitor precursor ($CF_2$) due to the equilibrium between precursor lost and precursor generated; and
(iii) estimating the flow rates of etchant ($SF_6$) precursor and fluorocarbon ($CH_4/CHF_3$) gases as the precursors for the sidewall passivation.

There are two techniques available for compensating for undercutting (of the mask) and under etching (or bowing) features with parallel sidewall so that truly vertical sidewalls can be achieved in the medium to be processed. The techniques are: 1) reducing the isotropic etching component, and 2) increasing the degree of sidewall passivation. We demonstrate these effects in FIGS. 1-3 with cross-sectional scanning electron micrographs of the etching profiles after gas chopping.

Figure 2:
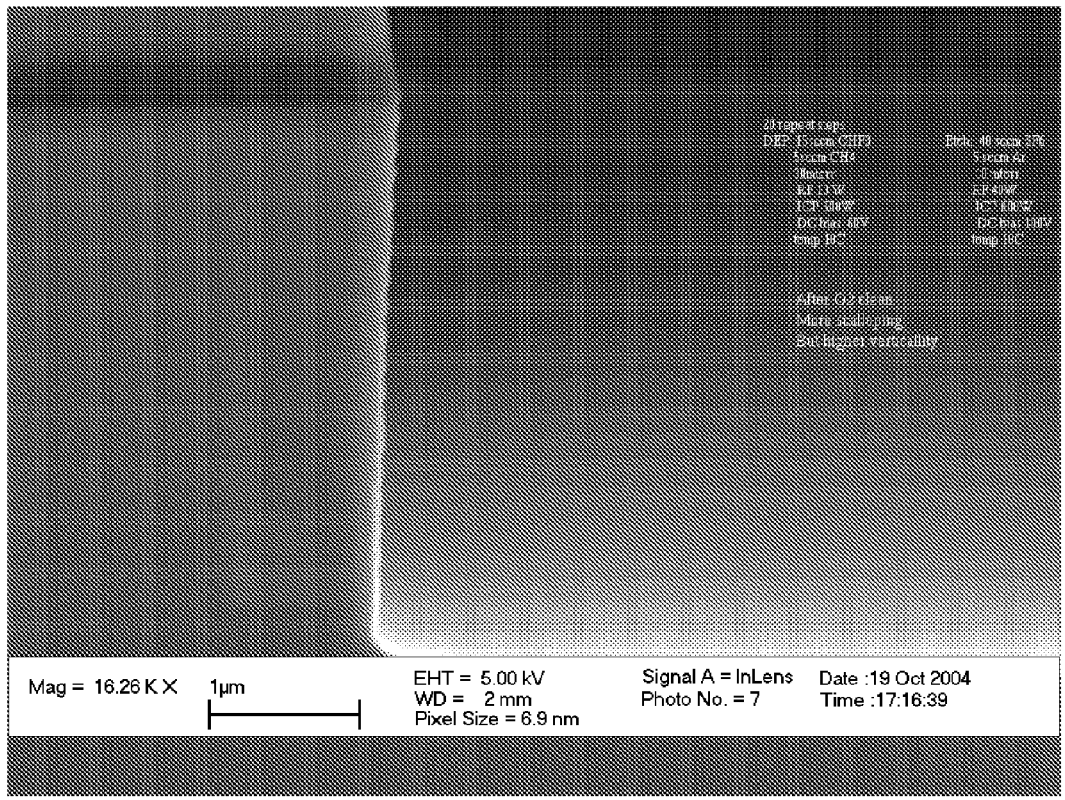
FIG. 2 is a schematic of the final process parameter estimation step: Substrate temperature 10° C. Reactor wall temperature: 60° C.; Etching: SF6: 5 sccm, Ar: 7 sccm, 8 mTorr, Rfbias=40 Watt, DC=−150V; Deposition: CHF3:15 sccm; CH4=7 sccm, Pressure: 30 mTorr, ICP=600 Watt, RFbias=15 Watt, DC=−85 V.

FIG. 1 shows a slightly modified gas chopping profile with scallops in the range of 34 nm in magnitude. The next FIG. 2 shows that the vertical etching rate of silicon and the sidewall passivation are near equilibrium. FIG. 2 shows a reduction in sidewall scalloping with the same process parameters. The difference here is that the chamber has seen more gas chopping cycles. Thus, we have demonstrated the importance of the chamber conditioning in providing adequate $CF_2$ passivation.

To further reduce the isotropic etching component and reduce sidewall rippling, we need to lower the $SF_6$ flux. FIG. 3 shows that by reducing the $SF_6$ flux, sidewall ripples are now in the 5 nm range peak to peak.

Figure 3A:
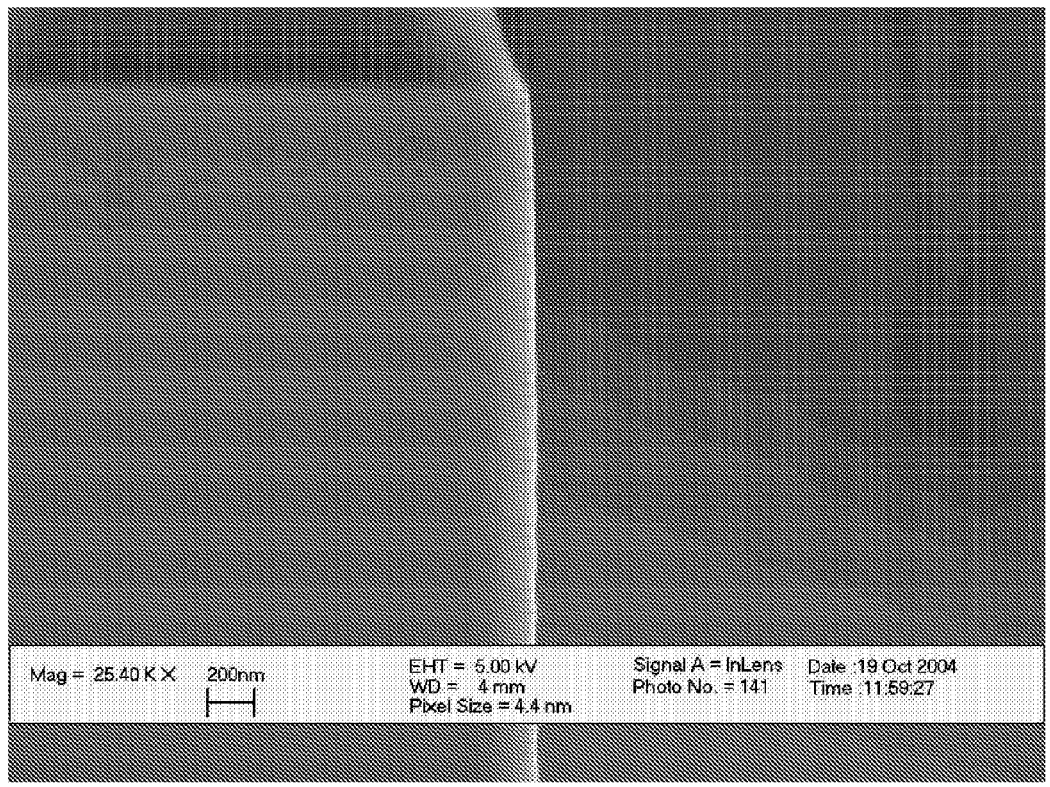
FIG. 3A is a scanning electron micrograph that shows the effect on the ripples size due to increasing the etchant precursor concentration to $SF_6$ 04 sccm, Ar=5 sccm.
Figure 3A:
Figure 3B:
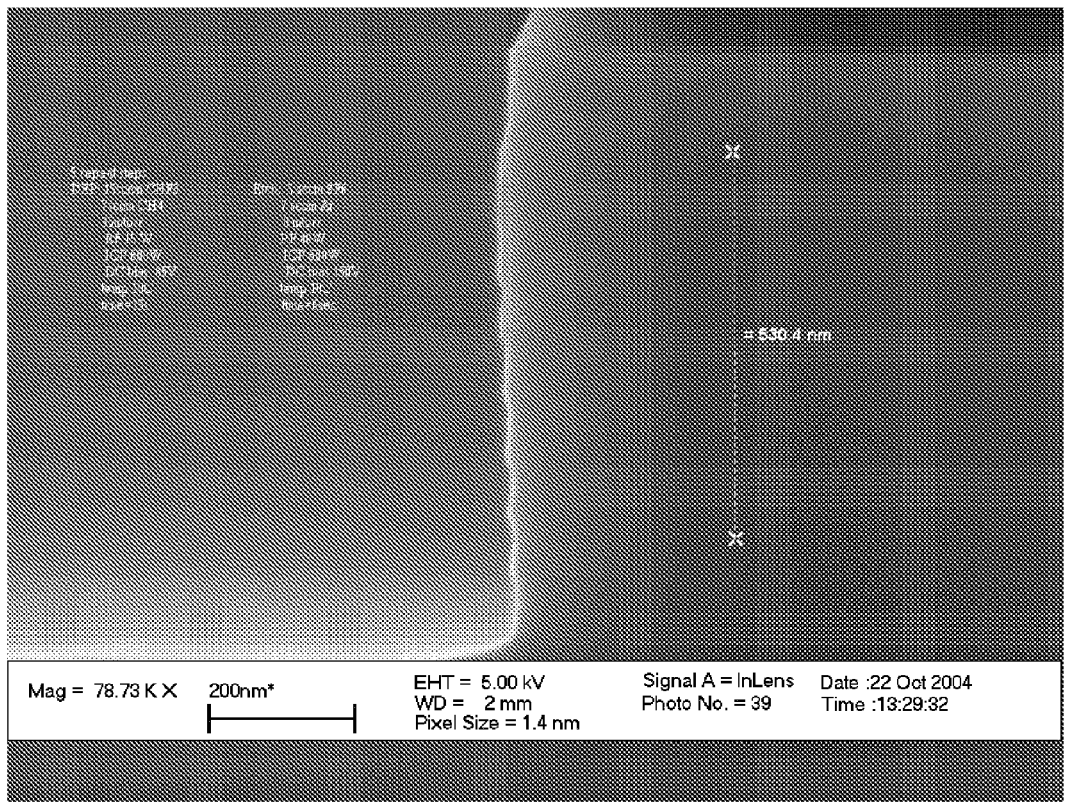
FIG. 3B is a scanning electron micrograph that shows the effect on the ripples size due to increasing the etchant precursor concentration to $SF_6$ 14 sccm, Ar=7 sccm.
Figure 3B:
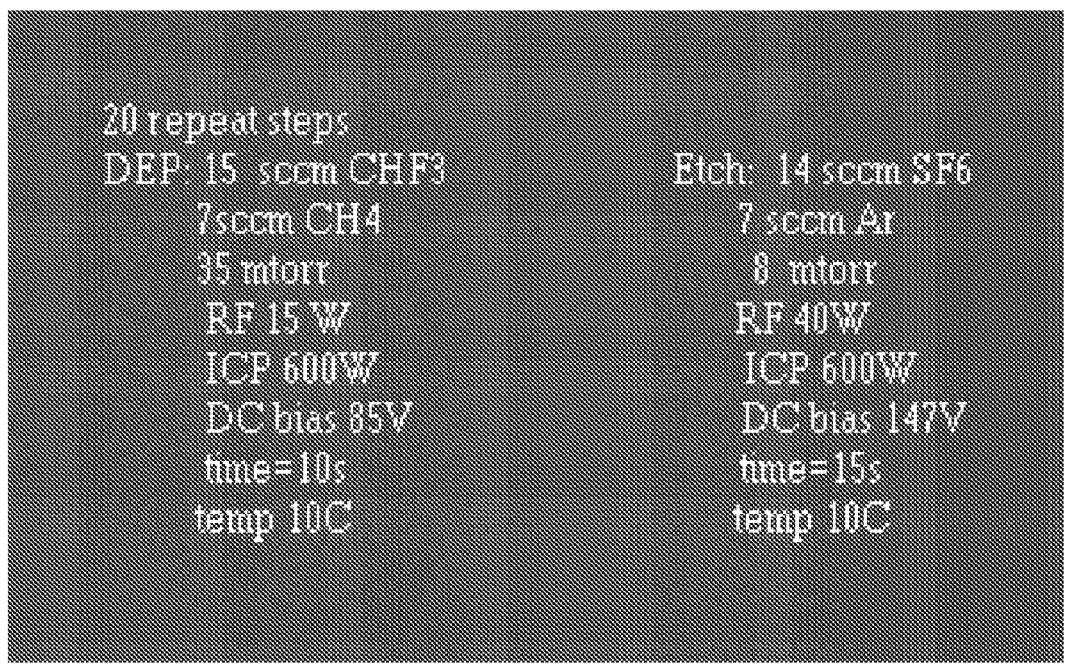

These conditions are confirmed during the next experiment shown in FIG. 3A, where the 20 ripples are practically negligible after the 20 passivation and etch cycles. FIG. 3B shows higher sidewall roughness as a consequence of higher DC bias voltages, and the process still not quite "dialed in" for optimal sidewall smoothness.

Figure 3C:
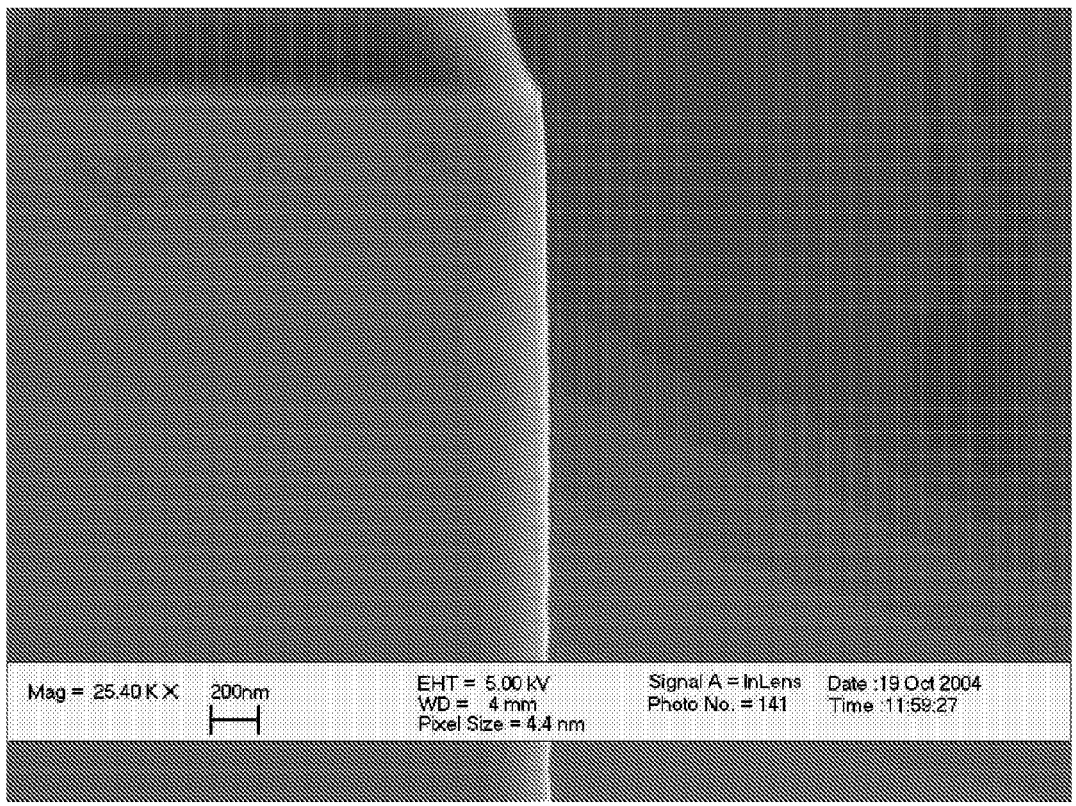
FIG. 3C is a scanning electron micrograph that shows the effect on the ripples size due to increasing the etchant precursor concentration to $SF_6$ 5 sccm, Ar=7 sccm.
Figure 3C:
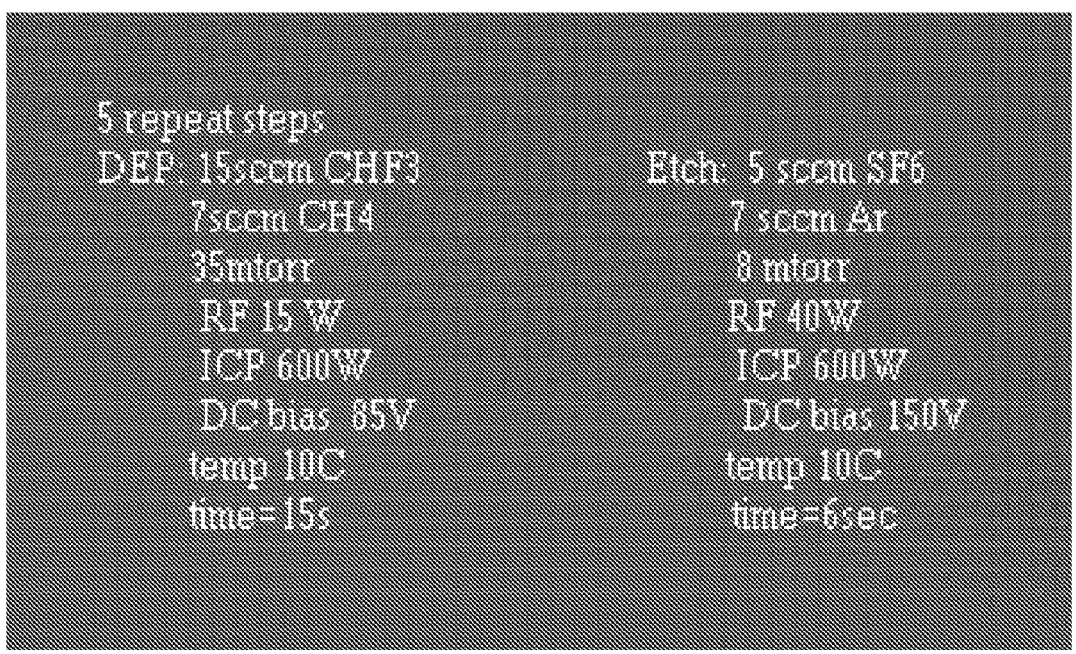

FIG. 3C shows an extremely smooth sidewall in only 5 cycles of passivation and etching.

Figure 4A:
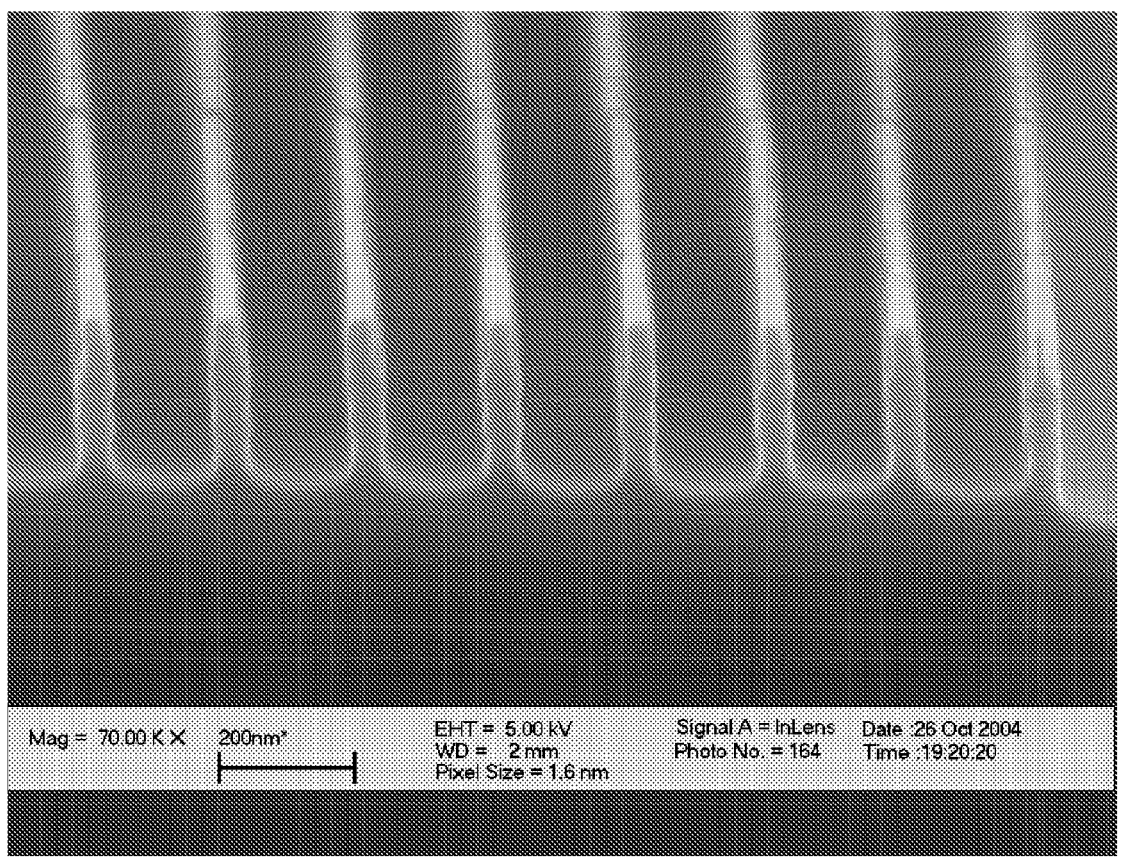
FIG. 4A is a scanning electron micrograph that shows formed scallops in the range of 1 to 5 nm.
Figure 4B:
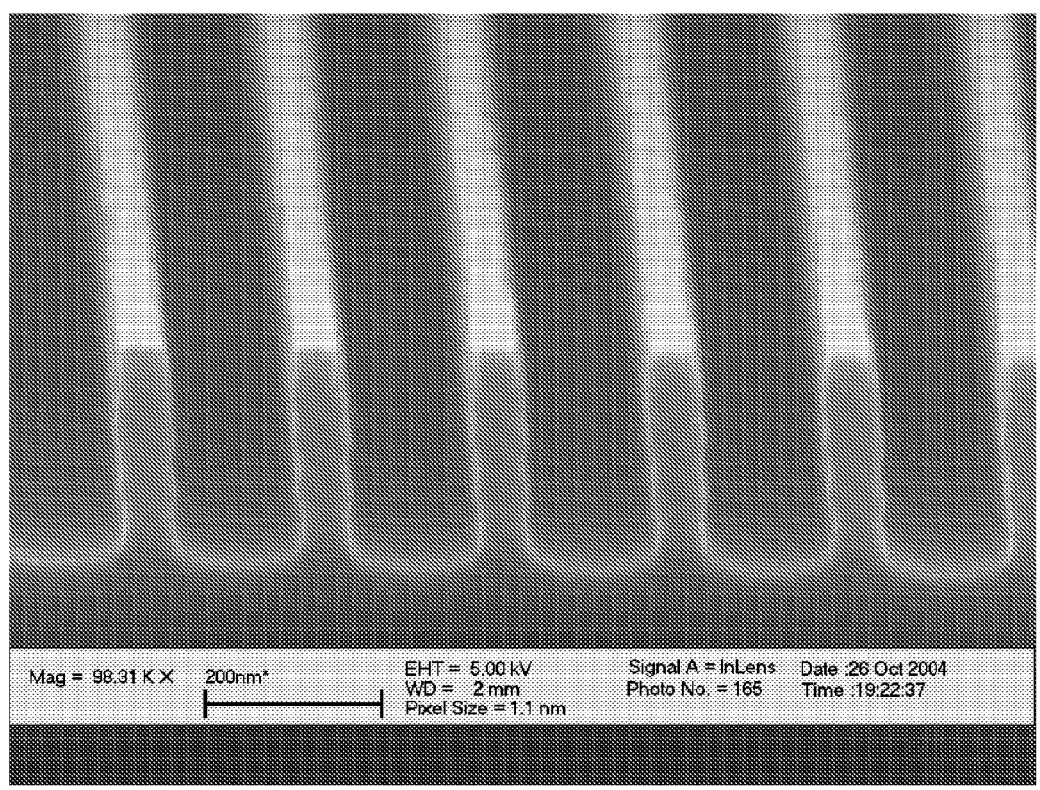
FIG. 4B is a scanning electron micrograph that shows formed scallops in the range of 40 nm peak to peak.

In FIG. 4A, using a high resolution patterned HSQ mask, the achieved sidewall roughness was approximately 5 nm. FIG. 4B is another electron micrograph at a slightly higher magnification.

Figure 4C:
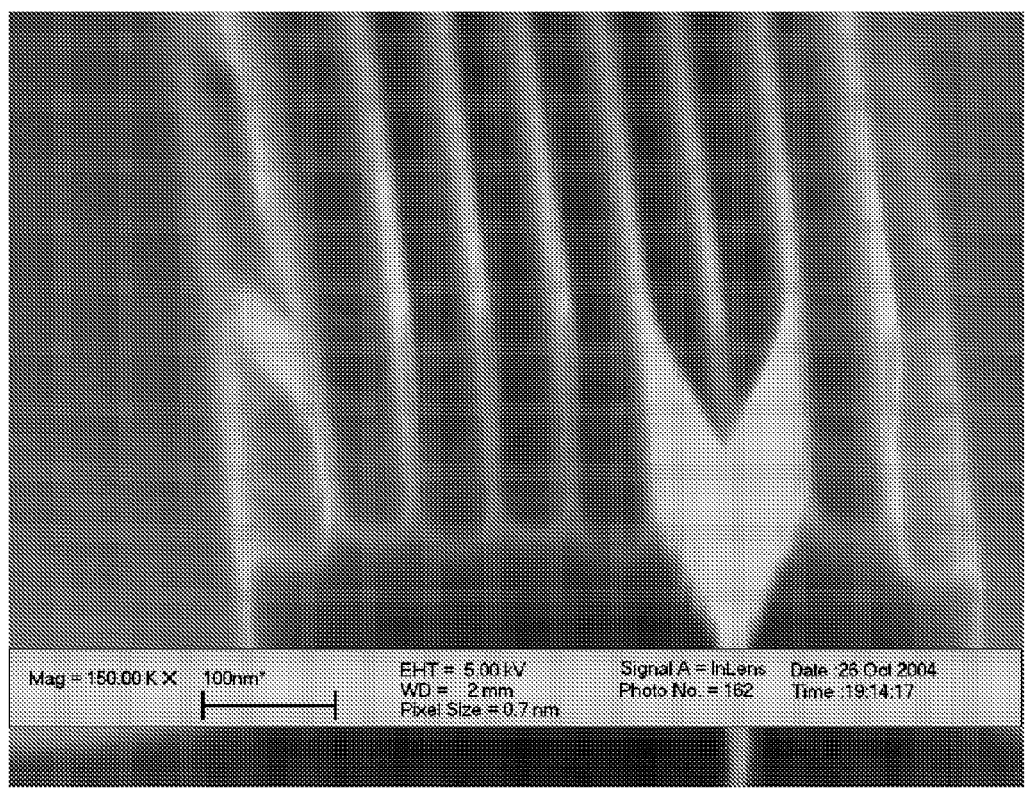
FIG. 4C is a scanning electron micrograph that shows formed scallops in the range of 10 nm width and 200 nm high features etched in Si using E-beam patterned HSQ as mask. The processing parameters were: 1) Etching step: 6 sec, DC=−150V, 8 mTorr; and 2) Passivation step: 10 sec DC=−80V, 35 mTorr.

FIG. 4C shows trenched features apparently about 168 nm deep, with a feature width of about 11 nm, for a depth to width ratio of about 15. Surface roughness, as measured from the micrograph, appears to be less than 5 nm.

Figure 5:
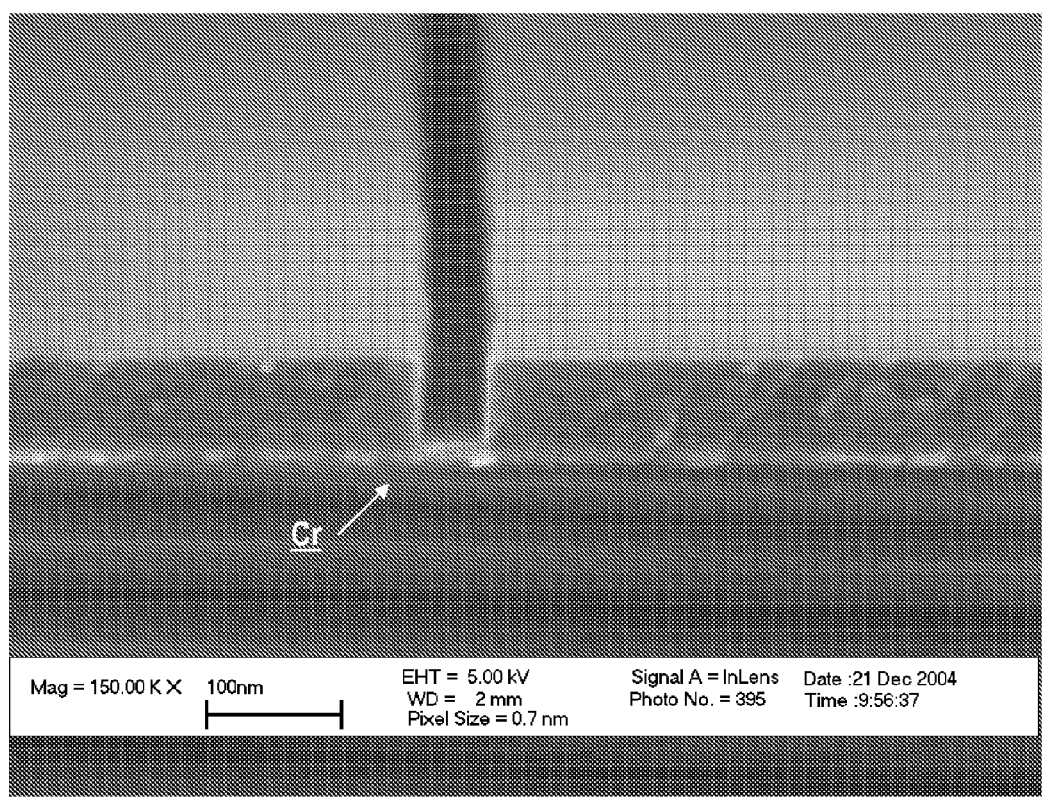
FIG. 5 is a scanning electron micrograph that shows a 40 nm line etched in poly-Si using E-beam patterned ZEP-520 resulting in sidewall ripples that are nearly undetectable.

FIG. 5 shows a trench etched using a ZEP-520 photoresist mask. Sidewall roughness is below the resolution of the micrograph.

CONCLUSIONS

This application has disclosed a technique capable of generating vertical sidewalls with negligible scallops (1-2 nm) in silicon features as small as 20 nm with an aspect ratio of 20 for nano-imprint lithography fabrication.

By using gas precursor profile feedback control with respect to the balance between sidewall passivators and etchant precursors it is thought that the process can push the pattern transfer limit to the limitations of the initial lithographic resolution limits.

All publications, patents, and patent applications mentioned in this specification are herein incorporated by reference to the same extent as if each individual publication or patent application were each specifically and individually indicated to be incorporated by reference. Additionally, all patents and publications attached hereto and submitted herewith, even if not otherwise described in this application, are hereby incorporated by reference.

The description given here, and best modes of operation of the invention, are not intended to limit the scope of the invention. Many modifications, alternative constructions, and equivalents may be employed without departing from the scope and spirit of the invention.

We claim:

1. A method of etching radical reduced, gas chopped deep reactive ion etching comprising:
 a) conditioning a chamber comprising:
  i) discharging an etchant and a passivator in the chamber, wherein the passivator is polytetrafluoroethane (PTFE), and
  ii) ionizing at least some of the etchant and passivator in a plurality of passivation-etching cycles; such that the inside of the chamber comprises $CF_2$ and $CF_x$, wherein x is 1, 2, or 3, having a $CF_2/CF_x$ ratio higher than if the chamber was not conditioned, wherein subsequent steps b) to d) take place inside said chamber;
 b) etching a material using a means for gas chopped ion etching comprising:
  i) the etchant; and
  ii) the passivator;
 c) ionizing at least some of the etchant and passivator of step b); and
 d) controlling a concentration of radicals produced by the ionizing of the etchant;
such that a smooth sidewall is produced on the material being etched, wherein the smooth sidewall has a surface roughness of less than 5 nm RMS.

2. The method of claim 1, wherein the smooth sidewall has a surface roughness of less than 2 nm RMS.

3. The method of claim 2, wherein the smooth sidewall has a surface roughness of less than 1 nm RMS.

4. The method of claim 1 wherein the controlling step comprises:
   providing a getter to reduce the concentration of radicals produced by the ionizing of the etchant.

5. The method of claim 4, wherein the getter comprises:
   a source of hydrogen that reacts with radicals produced by the ionizing of the etchant, so as to render the etchant ineffective at etching.

6. The method of claim 4, wherein the getter comprises: a source of hydrogen selected from the group consisting of:
   i) hydrogen gas, forming gas, methane, butane, a hydrocarbon, a mixture of hydrogen gas and one or more inert gasses.

7. The method of claim 1, wherein the etchant comprises:
   a chemically active etchant; and
   a relatively nonreactive or inert moiety used in ion bombardment.

8. The method of claim 1, wherein the passivator comprises:
   a gaseous vapor phase $CF_2$.

9. The method of claim 8, wherein the gaseous vapor phase $CF_2$ is evolved from a heated surface.

10. The method of claim 1, wherein the material comprises Al, Mo, Ti, Si, W or Cr.

11. The method of claim 10, wherein the smooth sidewall is of a feature having at least 70 nm in depth.

12. The method of claim 11, wherein the smooth sidewall is of a feature having at least 168 nm in depth.

13. The method of claim 1, wherein the smooth sidewall is of a feature having a depth to width ratio of about 15.

14. The method of claim 1, wherein the smooth sidewall is of a feature having an aspect ratio of at least 20.

15. The method of claim 1, wherein said conditioning comprises a dummy discharge of fluorocarbon plasma at a chamber wall temperature of over 50° C.

16. The method of claim 15, wherein said conditioning comprises cycling through passivation-etching cycles.

17. The method of claim 16, wherein said conditioning comprises cycling through 10 to 40 passivation-etching cycles.

18. The method of claim 1, wherein during said etching the pressure inside the chamber ranges from 1 to 15 mT.

19. The method of claim 1, wherein the $CF_2/CF_x$ ratio is 100 times higher than if the chamber was not conditioned.

20. The method of claim 19, wherein the $CF_2/CF_x$ ratio is 1,000 times higher than if the chamber was not conditioned.

* * * * *